(12) United States Patent
Whitney

(10) Patent No.: US 11,630,794 B2
(45) Date of Patent: *Apr. 18, 2023

(54) CABINET LEVEL CONTROLLER WITH ASSET MANAGEMENT

(71) Applicant: CYBER SWITCHING PATENTS, LLC, San Jose, CA (US)

(72) Inventor: David Whitney, San Jose, CA (US)

(73) Assignee: CYBER SWITCHING PATENTS, LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/588,318

(22) Filed: Jan. 30, 2022

(65) Prior Publication Data

US 2022/0156218 A1     May 19, 2022

Related U.S. Application Data

(63) Continuation of application No. 16/733,732, filed on Jan. 3, 2020, now Pat. No. 11,237,999, which is a continuation of application No. 15/655,776, filed on Jul. 20, 2017, now Pat. No. 10,528,511, which is a continuation of application No. 14/184,490, filed on Feb. 19, 2014, now Pat. No. 9,727,515.

(51) Int. Cl.
| | |
|---|---|
| *G06F 13/40* | (2006.01) |
| *H05K 7/14* | (2006.01) |
| *H04L 67/141* | (2022.01) |
| *H04L 67/12* | (2022.01) |

(52) U.S. Cl.
CPC .......... *G06F 13/4068* (2013.01); *H04L 67/12* (2013.01); *H04L 67/141* (2013.01); *H05K 7/1492* (2013.01); *Y04S 40/18* (2018.05)

(58) Field of Classification Search
CPC ... G06F 13/4068; H04L 67/12; H04L 67/141; H05K 7/1492; Y04S 40/18; Y02D 10/00
See application file for complete search history.

(56) References Cited

U.S. PATENT DOCUMENTS

| | | |
|---|---|---|
| 6,064,192 A | 5/2000 | Redmyer |
| 7,550,870 B2 | 6/2009 | Reynolds et al. |
| (Continued) | | |

FOREIGN PATENT DOCUMENTS

| | | |
|---|---|---|
| WO | WO2012008979 | 1/2012 |

*Primary Examiner* — Pinping Sun
(74) *Attorney, Agent, or Firm* — Inventive Law Inc.; Jim H. Salter

(57) ABSTRACT

Various embodiments for managing assets in a data center device rack include: establishing a data connection between a cabinet level controller and at least one primary power distribution unit (PDU); using a first electrical outlet on the primary PDU to establish an electrical connection between the primary PDU an electrical asset in a data center equipment rack; using a first asset interface connector on the cabinet level controller to establish a data connection between the cabinet level controller and the electrical asset in the data center equipment rack, the first electrical outlet and the first asset interface connector being in horizontal alignment; using a router integrated into the cabinet level controller to connect the cabinet level controller to a wide area Internet Protocol (IP) network; and using the router to establish a single IP address corresponding to a plurality of electrical assets in the data center equipment rack.

20 Claims, 9 Drawing Sheets

(56) References Cited

U.S. PATENT DOCUMENTS

| | | |
|---|---|---|
| 7,598,724 B2 | 10/2009 | Howell et al. |
| 7,630,186 B2 | 12/2009 | Reynolds et al. |
| 7,672,104 B2 | 3/2010 | Reynolds et al. |
| 8,024,073 B2 | 9/2011 | Imes et al. |
| 8,051,327 B2 | 11/2011 | Seaton |
| 8,427,803 B2 | 4/2013 | Liberto et al. |
| 8,458,329 B2 * | 6/2013 | Kolin ................ H05K 7/20836 382/104 |
| 8,543,714 B2 | 9/2013 | Chan |
| 8,560,256 B2 | 10/2013 | Gu et al. |
| 8,803,660 B2 | 8/2014 | Martin |
| 8,816,857 B2 | 8/2014 | Nordin |
| 9,081,568 B1 | 7/2015 | Ross |
| 9,414,531 B1 | 8/2016 | Towner |
| 9,727,515 B2 | 8/2017 | Whitney |
| 10,528,511 B2 * | 1/2020 | Whitney ............. H05K 7/1492 |
| 11,237,999 B2 * | 2/2022 | Whitney ................ H04L 67/12 |
| 2002/0134567 A1 | 9/2002 | Rasmussen |
| 2004/0024483 A1 | 2/2004 | Holcombe |
| 2005/0252957 A1 * | 11/2005 | Howarth ............... G01S 13/825 340/572.1 |
| 2006/0116023 A1 | 6/2006 | Spitaels |
| 2008/0317021 A1 * | 12/2008 | Ives .................... H04L 41/0806 370/389 |
| 2009/0108995 A1 | 4/2009 | Tucker |
| 2009/0116178 A1 | 5/2009 | Champion |
| 2009/0309754 A1 | 12/2009 | Bou et al. |
| 2010/0019575 A1 | 1/2010 | Verges |
| 2010/0156665 A1 | 6/2010 | Krzyzanowski et al. |
| 2010/0225470 A1 * | 9/2010 | Marwah ................ H04W 4/18 340/539.13 |
| 2010/0289643 A1 | 11/2010 | Trundle et al. |
| 2010/0327800 A1 | 12/2010 | Reineccius |
| 2011/0046800 A1 | 2/2011 | Imes et al. |
| 2011/0047188 A1 | 2/2011 | Martins |
| 2011/0062780 A1 | 3/2011 | Verges |
| 2011/0093127 A1 | 4/2011 | Kaplan |
| 2011/0118894 A1 | 5/2011 | Reineccius et al. |
| 2011/0187503 A1 | 8/2011 | Costa |
| 2011/0248823 A1 * | 10/2011 | Silberbauer .......... H05K 7/1498 340/10.1 |
| 2011/0291813 A1 * | 12/2011 | Jansma ................ H05K 7/1498 340/10.5 |
| 2012/0181869 A1 | 7/2012 | Chapel |
| 2013/0031399 A1 * | 1/2013 | Watson ..................... G06F 1/26 713/340 |
| 2013/0086404 A1 | 4/2013 | Sankar et al. |
| 2013/0099720 A1 | 4/2013 | Chuah |
| 2013/0154370 A1 | 6/2013 | Albsmeier |
| 2013/0178996 A1 * | 7/2013 | Li ........................ H05K 7/1492 700/295 |
| 2013/0212411 A1 * | 8/2013 | Nicholson ............... H04L 12/10 713/310 |
| 2013/0293017 A1 | 11/2013 | Englert |
| 2014/0247537 A1 | 9/2014 | Nordin |
| 2015/0084419 A1 | 3/2015 | Wishman |
| 2015/0154433 A1 * | 6/2015 | Stewart ............. G06K 19/0723 340/10.1 |
| 2015/0234440 A1 | 8/2015 | Gardner |
| 2015/0236512 A1 | 8/2015 | Whitney |
| 2016/0105988 A1 | 4/2016 | Englert |
| 2017/0358041 A1 | 12/2017 | Forbes |

* cited by examiner

```
┌─────────────────────────────────┐
│      ASSET MANAGEMENT           │
│  IN A DATA CENTER DEVICE RACK   │
│            -401-                │
└─────────────────────────────────┘
                │
                ▼
┌─────────────────────────────────────────────────────┐
│ Establish a data connection between a cabinet level │
│ controller and at least one primary power           │
│ distribution unit (PDU).                            │
│                      -410-                          │
└─────────────────────────────────────────────────────┘
                │
                ▼
┌─────────────────────────────────────────────────────┐
│ Use a first electrical outlet on the primary PDU to │
│ establish an electrical connection between the      │
│ primary PDU an electrical asset in a data center    │
│ equipment rack.                                     │
│                      -420-                          │
└─────────────────────────────────────────────────────┘
                │
                ▼
┌─────────────────────────────────────────────────────┐
│ Use a first asset interface connector on the cabinet│
│ level controller to establish a data connection     │
│ between the cabinet level controller and the        │
│ electrical asset in the data center equipment rack, │
│ the first electrical outlet and the first asset     │
│ interface connector being in horizontal alignment.  │
│                      -430-                          │
└─────────────────────────────────────────────────────┘
                │
                ▼
┌─────────────────────────────────────────────────────┐
│ Use a router integrated into the cabinet level      │
│ controller to connect the cabinet level controller  │
│ to a wide area Internet Protocol (IP) network.      │
│                      -440-                          │
└─────────────────────────────────────────────────────┘
                │
                ▼
┌─────────────────────────────────────────────────────┐
│ Use the router to establish a single IP address     │
│ corresponding to a plurality of electrical assets   │
│ in the data center equipment rack.                  │
│                      -450-                          │
└─────────────────────────────────────────────────────┘
                │
                ▼
            ( End )
```

Figure 8

CABINET LEVEL CONTROLLER WITH ASSET MANAGEMENT

REFERENCE TO PRIORITY PATENT APPLICATIONS

The present application is a continuation patent application of Ser. No. 16/733,732, filed on Jan. 3, 2020; which is a continuation patent application of Ser. No. 15/655,776, filed on Jul. 20, 2017; which is a continuation patent application of Ser. No. 14/184,490, filed on Feb. 19, 2014. This present non-provisional patent application draws priority from the referenced patent applications. The entire disclosure of the referenced patent applications is considered part of the disclosure of the present application and is hereby incorporated by reference herein in its entirety.

TECHNICAL FIELD

The disclosed subject matter relates to the field of device monitoring and control, and more particularly to managing assets in a data center device rack.

COPYRIGHT

A portion of the disclosure of this patent document contains material that is subject to copyright protection. The copyright owner has no objection to the facsimile reproduction of the patent document or the patent disclosure, as it appears in the Patent and Trademark Office patent files or records, but otherwise reserves all copyright rights whatsoever. The following notice applies to the software and data as described below and in the drawings that form a part of this document: Copyright 2012-2022 C.H. Reynolds Electric, Inc., All Rights Reserved.

BACKGROUND

A standard data center can be configured with rows of racks or cabinets that have installed therein a variety of assets or electronic systems, such as computing systems, networking systems, communications systems, or other types of electrical devices. The data center equipment rack assets (e.g., computers, storage devices, servers, routers, networking devices, communications systems, etc.) consume electrical power for their operation. The computing systems, networking systems, and communications systems of the data center may reside in these racks. In a typical data center, there may be dozens or even hundreds of electrical devices. Each of these devices is connected to an electrical power source. Each of these assets needs to be identified and managed in an efficient manner.

The problem of managing assets in a data center equipment rack is complex for several reasons. First, the quantity of devices that consume power can be very large. Any solution will need to be cost effective and will need to apply to large as well as small data centers or collections of electronic assets. Secondly, data centers use a variety of devices and mechanisms to deliver power. Any solution will need to address the heterogeneity and legacy issues in the data center. Finally, a large number of devices or systems in data centers can be idle or outdated.

In some cases, data center operators have responded by installing Smart power strips, power distribution strips, or rack Power Distribution Units (PDUs) that can deliver and measure power at the rack or at the plug level. Some of these PDUs can use the Internet Protocol (IP) network to transfer this information. Unfortunately, the networking capabilities of many of the conventional PDUs are not utilized because of the cost and complexity of connecting them to the IP network.

Electrical power in data centers is typically distributed from Uninterruptable Power Systems (UPS) to servers from Power Distribution Units (PDUs) that transform the voltage from 480 VAC to 208/110 VAC to internal electrical distribution panel boards or external power panel boards. The panel boards contain individual electrical circuits of various current or amperage capacities. These electrical power circuits are connected to power distribution strips containing electrical outlets in equipment racks placed in the data center to supply the power needs of electronic assets in the equipment racks.

The power distribution topology provided in the data center may be single path or non-redundant with only one set of UPS. PDUs can be installed to provide power to the servers with a single power supply and one plug connection. The topology may also be dual path or redundant whereby multiple UPS systems and two sets of PDUs are installed to provide power from two different electrical systems to each server, which is designed with redundant power supplies that are powered independently from two rack power distribution units or strips (PDUs). In another data center electrical topology, a primary UPS of a redundant set of UPS systems feeds single PDUs through static transfer switches (STS). If the primary UPS fails, the STS automatically switches the PDU to the alternate back-up source UPS of the redundant set of UPS systems.

Each server's maximum power requirement at full load is required to be provided to the outlet plug in either a single or dual path topology. To meet this requirement each power distribution strip is fed from a PDU electrical circuit that may vary in voltage and power capacity as required by the information technology (IT) equipment to be housed in each equipment rack.

The number and type of servers that may be housed in a specific equipment rack is bound by how much electrical load can be put on each circuit (known as circuit capacity), which typically is between 20-100 amps per circuit. Power is fed from the PDU through the power distribution panel and through a circuit breaker, which is a device that enables a safe means of turning off power being fed from the PDU to the rack power strips for installation and maintenance purposes and to protect the electrical power distribution system from overloading and damage if the server load connected to the circuit exceeds its rated maximum capacity. Given the complexities of the various aggregations of data center equipment, some mechanism is needed to enable data center operators to remotely manage data center equipment and the power consumption of data center equipment.

BRIEF DESCRIPTION OF THE DRAWINGS

The various embodiments are illustrated by way of example, and not by way of limitation, in the figures of the accompanying drawings in which:

FIG. 8 is a flow diagram illustrating the basic processing flow for a particular embodiment.

DETAILED DESCRIPTION

In the following detailed description, a reference is made to the accompanying drawings that form a part hereof, and in which are shown, by way of illustration, specific embodiments in which the disclosed subject matter can be practiced. It is understood that other embodiments may be utilized and structural changes may be made without departing from the scope of the disclosed subject matter.

According to various example embodiments of the disclosed subject matter as described herein, there is provided an apparatus and method for managing assets in a data center equipment rack. A particular embodiment relates to a cabinet level controller that can monitor electrical power delivered to electrical assets connected to a PDU and gather power usage/consumption information from electrical assets connected to PDUs. The cabinet level controller can also be connected to a wide area data network (e.g., the Internet) via an Ethernet, Universal Serial Bus (USB), or serial (e.g., wired) data connection or a WiFi or Bluetooth (e.g., wireless data connection).

Figure 1:
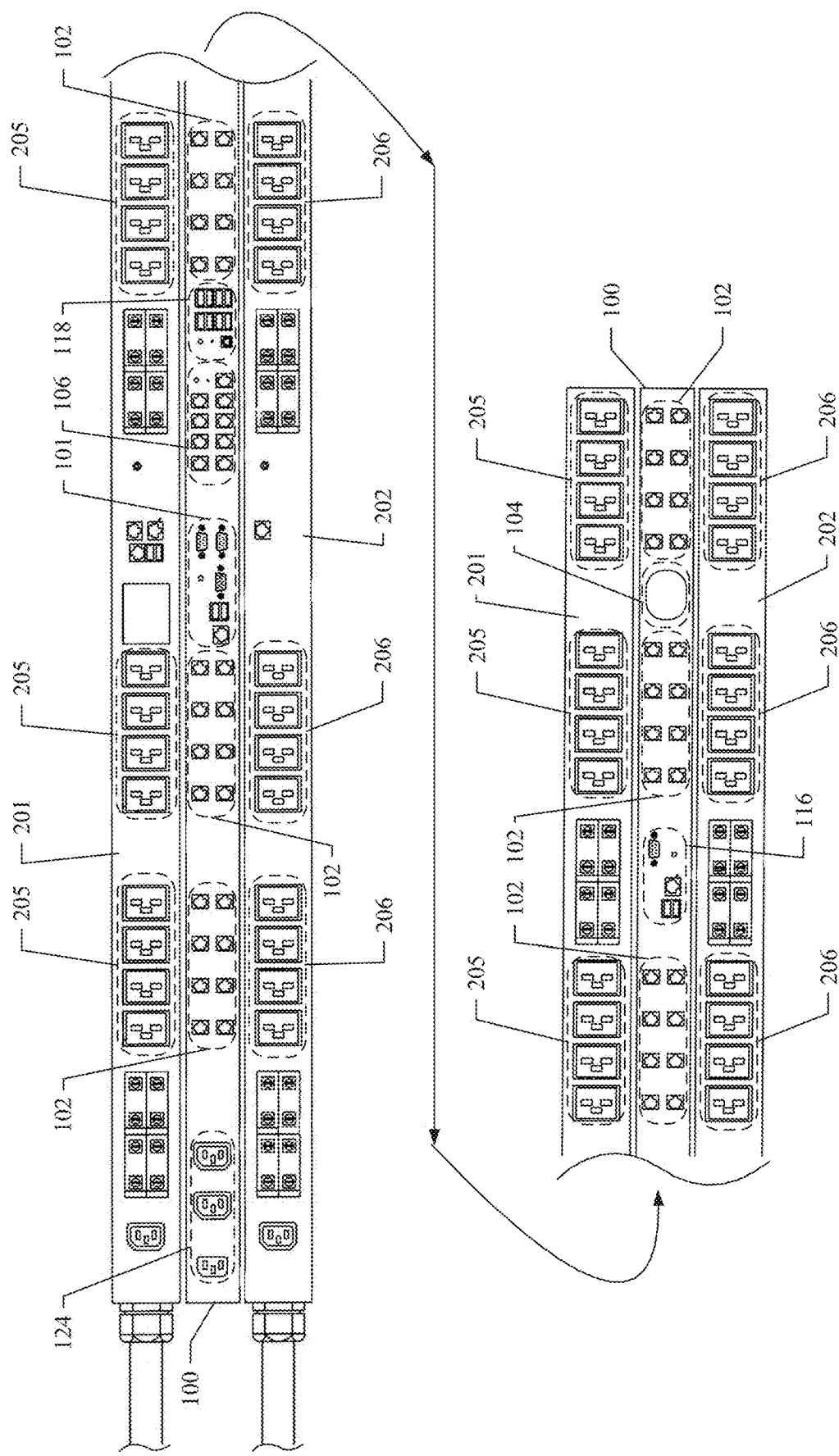
FIG. 1 illustrates a cabinet level controller of an example embodiment.

Referring now to FIG. 1, the cabinet level controller 100 of an example embodiment supports the management of assets in a data center in the context of Data Center Infrastructure Management (DCIM). DCIM is a form of data center management, which extends the more traditional systems and network management approaches to include the physical and asset-level components. These physical and asset-level component considerations include the management and tracking of the physical location of assets within the data center and, more particularly, the physical location of assets within a rack or cabinet in the data center. DCIM leverages the integration of information technology (IT) and facility management disciplines to centralize monitoring, management and intelligent capacity planning of a data center's critical systems. Essentially, DCIM provides a significantly more comprehensive view of all of the resources within the data center. The cabinet level controller 100 of an example embodiment makes this comprehensive view possible.

As shown in FIG. 1, the cabinet level controller 100 of an example embodiment is coupled to a primary PDU 201 and a secondary PDU 202. Each of PDUs 201 and 202 is configured to supply electrical power to a single rack or cabinet of electrical assets in a data center. In a particular embodiment, the PDUs 201/202 can be 208V (or 230V, 480V, or the like), 3-Phase, 60A electrical power distribution units with double pole circuit breakers and power metering.

The PDUs 201/202 can also include power measurement circuitry for sampling and measuring the electrical power consumed by electrical devices connected to each of the electrical outlets on each of the PDUs 201/202. The PDUs 201/202 can include circuitry for converting the sampled electrical power consumption measurements into power consumption data, which can be transferred to the cabinet level controller 100. In this manner, the PDUs 201/202 can perform among the following power measurements and system data generation. In an example embodiment, the PDUs 201/202 can:

Measure power at each server plug load;
Measure instantaneous power (watts);
Measure and store the highest (max) and lowest (min) power (watts);
Measure and store volts per phase, current per phase and power factor;
Calculate an average power (watts), peak power (watts), low power (watts), average volts per phase, average current per phase, and average power factor; and
Aggregate these metrics over time t, where t is configurable.

The PDUs 201/202 may locally store the measured and/or calculated power capacity/usage/consumption data, generally denoted system data, in long-term data storage on the PDU 201/202 device itself. Periodically, the PDUs 201/202 can send the measured and converted system data to the cabinet level controller 100 to which the PDU is connected. Alternatively, the cabinet level controller 100 can poll the PDU 201/202 for the power usage/consumption data. Thus, the cabinet level controller 100 can communicate with data center equipment rack PDUs to monitor and control power to the outlet level.

It will be understood by those of ordinary skill in the art in view of the present disclosure that a particular data center may include a plurality of racks or cabinets and thus a plurality of corresponding PDUs 201/202 and cabinet level controllers 100. As shown in FIG. 1, each PDU 201/202 includes a plurality of electrical outlets 205 and 206 to which the electrical assets in the rack may be connected.

Figure 2:
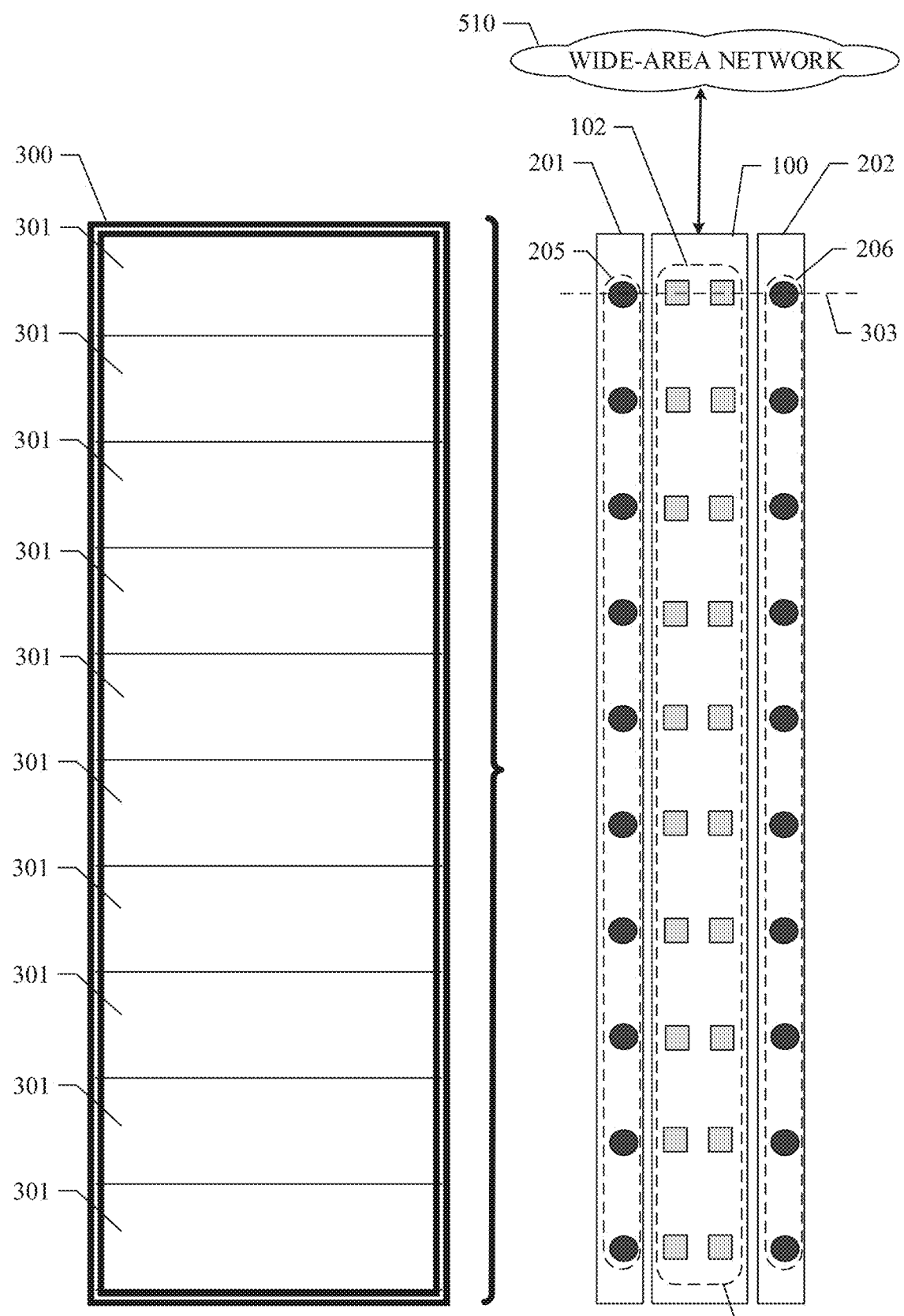
FIG. 2 illustrates an example embodiment of a cabinet level controller in association with a data center equipment rack or cabinet in which electrical assets may physically reside and corresponding primary and secondary PDUs.

Referring now to FIG. 2, a rack or cabinet 300 is shown to include a plurality of unit spaces 301 in which the electrical assets of the rack 300 may physically reside. Adjacent to the rack 300, a combination of one or two PDUs 201/202 and a cabinet level controller 100 can be provided as shown in FIG. 2. The plurality of electrical outlets 205 and 206 of each of the PDUs 201/202 can be connected to the electrical assets residing in the unit spaces 301 of the rack 300. As a result, the PDUs 201/202 can provide electrical power for each of the electrical assets in rack 300. The Primary PDU 201 can provide primary electrical power for each of the electrical assets in rack 300. The Secondary PDU 202 can provide secondary or backup electrical power for each of the electrical assets in rack 300. A transfer switch can be used to select either the Primary PDU 201 or the Secondary PDU 202 as the electrical power source for the electrical assets in rack 300.

The cabinet level controller 100 can provide a plurality of asset interface connectors 102 for communicating with the electrical assets in rack 300. As shown in FIGS. 1 and 2, a pair or plurality of asset interface connectors 102 is provided on the cabinet level controller 100 in an example embodiment for communicating with each of the electrical assets in rack 300. In the example embodiment, each of the asset interface connectors 102 can be implemented as RJ45 type connectors, such as those used for standard Ethernet data connections. The asset interface connectors 102 can be used to connect the cabinet level controller 100 to an Ethernet port of a corresponding electrical device in rack 300. As a result, in one embodiment, the cabinet level controller 100 can use standard data connector types and networking protocols to communicate with electrical assets in rack 300.

In other embodiments, the cabinet level controller 100 can support integrated out-of-band management (sometimes called lights-out management or LOM) interfaces. In this embodiment, the asset interface connectors 102 can be used to connect the cabinet level controller 100 to a port of a corresponding electrical device in rack 300 and thereby allow a system administrator to monitor and manage electrical devices in rack 300 (e.g., servers and/or other network equipment) by remote control regardless of whether the electrical device is powered on, or whether an operating system is installed or functional on the corresponding electrical device.

In other embodiments, the cabinet level controller 100 can support asset interface connectors 102 implemented as Universal Serial Bus (USB) interfaces. In this embodiment, the asset interface connectors 102 can be used to connect the cabinet level controller 100 to a USB port of a corresponding electrical device in rack 300. As a result, in this embodiment, the cabinet level controller 100 can use standard networking protocols or data communication protocols to communicate with electrical assets in rack 300.

Additionally, in other embodiments, the cabinet level controller 100 can support a management interface implemented using a serial data connection, such as a standard RS-232 data connection and the related protocol. In this case, the asset interface connectors 102 can be implemented as standard RS-232 data interface connectors, which connect to a corresponding port on a corresponding electrical device in rack 300. Alternatively, a USB to RS-232 converter can be used to implement the most convenient type of data interface connector and still enable connection to a corresponding electrical device in rack 300. In this embodiment, the asset interface connectors 102 can be used to connect the cabinet level controller 100 to a serial management console port of a corresponding electrical device in rack 300 and thereby allow a system administrator to monitor and manage electrical devices in rack 300.

In yet another embodiment, the cabinet level controller 100 can implement the asset interface connectors 102 as a plurality of Internet Protocol (IP) Keyboard/Video/Mouse (IP-KVM) ports 102 for communicating with the electrical assets in rack 300. KVM interfaces are useful where there are multiple electrical assets (e.g., computers, servers, etc.) in a rack 300, but no need for a dedicated keyboard, monitor, and mouse for each one. KVM interfaces are frequently used in data centers where multiple servers are placed in a single rack with a single keyboard, monitor and mouse. A KVM switch then allows data center personnel to connect to any server in the rack 300. In this embodiment, the asset interface connectors 102 can be used to connect the cabinet level controller 100 to a KVM interface of a corresponding electrical device in rack 300. As a result, in this embodiment, the cabinet level controller 100 can use standard data communication protocols to communicate with electrical assets in rack 300. Additionally, the KVM interface enables the cabinet level controller 100 to communicate with the electrical assets in rack 300 using KVM data over IP, to implement IP source address filtering, to implement user/group management with permissions control, to support Basic Input/Output System (BIOS) system firmware level access, to support configurable port numbers (HTTP, HTTPS, Telnet, SSH), to provide Telnet console support, and virtual media support.

Thus, as evident from the description above, the asset interface connectors 102 of cabinet level controller 100 can be implemented in a variety of ways to enable the cabinet level controller 100 to connect with a variety of different types of data ports of a variety of different types of corresponding electrical devices in rack 300. As such, the cabinet level controller 100 is highly versatile and enabled to accommodate many different types of electrical devices in rack 300.

Given the quantity and variety of electrical assets in rack 300 and the limited physical space for power and data connections, it can be difficult in conventional electronic racks to determine how a particular electrical asset is connected or configured. To overcome this problem in conventional systems, the cabinet level controller 100 of an example embodiment provides a horizontal alignment between the electrical outlets 205 and 206 of each of the PDUs 201/202 and the asset connectors 102 associated with a particular electrical asset in rack 300. This horizontal alignment of the elements of the cabinet level controller 100 and the elements of the each of the PDUs 201/202 is illustrated by dashed line 303 shown in FIG. 2. Given the horizontal alignment of the elements (e.g., port alignment) of the cabinet level controller 100 with the corresponding elements of PDUs 201/202, a data center technician can readily determine the correspondence between the particular elements of PDUs 201/202, the particular elements of cabinet level controller 100, and the particular electrical asset of rack 300 to which they are connected. Element alignment (e.g., port alignment) of the cabinet level controller 100 provides single horizontal row element alignment of all the elements associated with a particular electrical asset of rack 300. These aligned elements include the Primary PDU outlet 205, the secondary PDU outlet 206, and asset connectors 102, including IP KVM ports, out-of-band management ports, USB ports, serial management control ports, and management controller (baseboard management controller—BMC) interfaces. As a result, cabling and power are easily grouped allowing for correlation between PDU outlets and asset data connectors 102, including IP KVM ports, out-of-band management ports, USB ports, serial management control ports, and the like. This element alignment feature of the various embodiments disclosed herein greatly increases the efficiency of managing the assets in a rack 300 of a data center.

Figure 3:
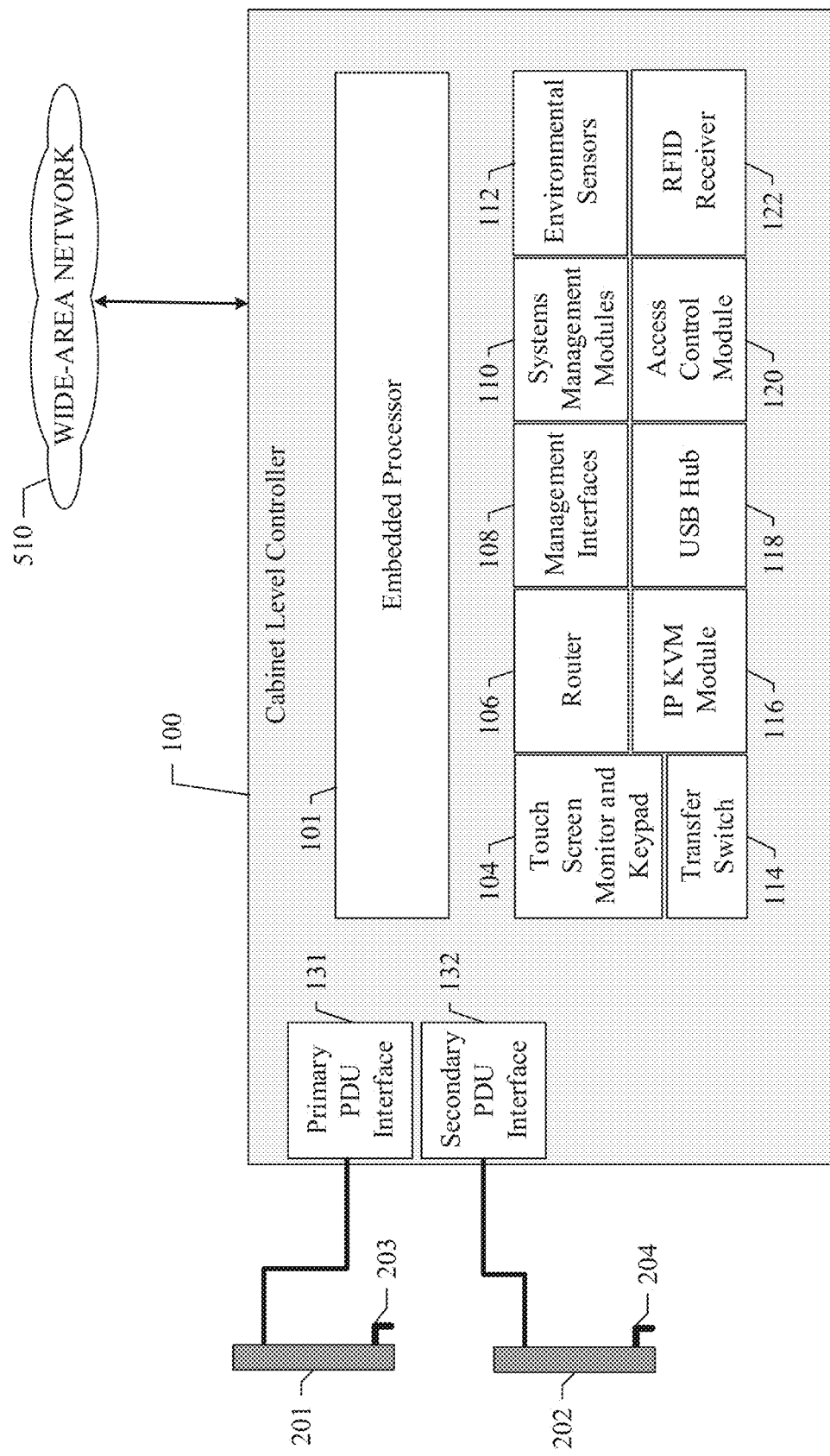
FIG. 3 illustrates a block diagram of the system components of the cabinet level controller of an example embodiment.

Referring now to FIG. 3, a block diagram of the system components of the cabinet level controller 100 of an example embodiment is illustrated. An example embodiment includes a primary PDU interface 131, which comprises a data interface between the cabinet level controller 100 and the primary PDU 201. The example embodiment also includes a secondary PDU interface 132, which comprises a data interface between the cabinet level controller 100 and the secondary PDU 202. The PDU data interfaces are well known to those of ordinary skill in the art. These interfaces enable the cabinet level controller 100 to obtain information related to the power usage at particular outlets of the PDUs 201/202 as described above. Each of the PDUs 201/202 is coupled to independent electrical power sources 203/204. It will be apparent to those of ordinary skill in the art that system configurations using a single PDU can also be supported by the cabinet level controller 100 of an example embodiment. If a dual PDU system configuration is used (i.e., a primary and secondary PDU are provided), a transfer switch 114 can be provided in the cabinet level controller 100 to switch between the primary PDU 201 and the secondary PDU 202. Thus, the transfer switch 114 can be used to source power from the primary PDU 201 or the secondary PDU 202. Additionally, the transfer switch 114 can include an auto-sense feature, which can be used to automatically switch between the primary PDU 201 and the secondary PDU 202 on a power failure event.

Referring still to FIG. 3, the cabinet level controller 100 of an example embodiment further includes an embedded data processor module 101 to control the operation of the components of the cabinet level controller 100. In one embodiment, the embedded data processor module 101, which can be integrated into the cabinet level controller 100, can include an embedded data processor implemented as an Intel® Atom 64-bit Dual Core N2600 1.6 GHz processor with a Windows® Embedded 7 (64-bit) operating system. A standard set of volatile and non-volatile memory modules (or optical or magnetic disk drives) can also be provided for use by the embedded data processor module 101 for data storage. It will be apparent to those of ordinary skill in the art that equivalent system configurations using a different brand or type of data processor are possible. As shown in FIG. 1, the embedded data processor module 101 of an example embodiment can also include a VGA interface connector, USB ports, an RJ45 connector for Ethernet or network communications, RS-232 ports for serial data communications, a power reset button, and a power LED.

The embedded data processor module 101 can also be used to control the operation of the touch screen monitor and keypad 104, which can be integrated into the cabinet level controller 100 as shown in FIGS. 1 and 3. The touch screen monitor and keypad 104 can be used by a technician to directly interact with and configure the operation of the cabinet level controller 100. In particular, technicians or other users can use the touch screen monitor and keypad 104 to view a representation of the rack contents, obtain power usage information, obtain environmental condition information, and control access to assets in the rack. Software installed or downloaded into the memory modules can be used by the embedded data processor module 101 to manage the touch screen monitor and keypad 104. In one embodiment, the touch screen monitor and keypad 104 can be implemented as a Liquid Crystal Display (LCD) touch screen display with a four wire touch screen using standard display and touch screen components. The touch screen monitor and keypad 104 can include a built-in speaker for audible prompts and interaction with a technician. The touch screen monitor and keypad 104 can also include an 84-key design keyboard or keypad with quiet-type key technology and an integrated multi-touch touch pad. It will be apparent to those of ordinary skill in the art that equivalent system configurations using a different brand or type of touch screen monitor and/or keypad are possible.

Referring still to FIGS. 1 and 3, the cabinet level controller 100 of an example embodiment can further include an Internet Protocol (IP) Keyboard Video Mouse (IP-KVM) module 116, which can be integrated into the cabinet level controller 100. In a particular embodiment, the cabinet level controller 100 can be connected to a separate computing platform via the IP-KVM module 116 to enable a technician to communicate with, configure, or test the cabinet level controller 100. In this case, the IP-KVM module 116 allows the cabinet level controller 100 to be configured without the use of a visual display, keyboard, or mouse. In other configurations, a visual display device, keyboard, and/or mouse can be connected to the cabinet level controller 100 via the IP-KVM module 116. As shown in FIG. 1 an embodiment of the IP-KVM module 116 includes: an RJ45 type data connector for network connection, a VGA data/display device connector, two USB connectors for keyboard and mouse devices, a power reset button, and a power indicator LED. The IP-KVM module 116 enables data center personnel to communicate with the cabinet level controller 100 and each of the electrical assets in rack 300 using a KVM interface.

Referring still to FIGS. 1 and 3, the cabinet level controller 100 of an example embodiment can further include a router 106. In the example embodiment, router 106 uses conventional network routing technology to support Internet Protocol version 6 (IPv6), the latest revision of the Internet Protocol (IP). IPv6 is a communications protocol that provides an identification and location system for computers on networks and routes traffic across the Internet. As such, router 106 also provides a link between the cabinet level controller 100 and a wide area network 510, such as the Internet. As shown in FIG. 1, the router 106 of an example embodiment is integrated into the cabinet level controller 100 and can include a plurality of RJ45 type connectors or ports for Ethernet or network communications, a power reset button, and a power LED. One of the RJ45 type connectors can be used to connect the cabinet level controller 100 to the wide area network 510, such as the Internet. As a result, the cabinet level controller 100 can obtain a data connection with a variety of network resources available via the network 510. Importantly, the router 106 can also provide a single IP address per rack or cabinet. This feature of the cabinet level controller 100 makes it easier to manage a plurality of racks or cabinets in a data center. In a particular embodiment, the router 106 of the cabinet level controller 100 can provide support as a Dynamic Host Configuration Protocol (DHCP) server with static IP. DHCP is a network protocol used to configure devices that are connected to a network (known as hosts) so they can communicate on that network using the Internet Protocol (IP). DHCP involves clients and a server operating in a client-server model. In a particular embodiment, the router 106 of the cabinet level controller 100 can also provide support as a DHCP client with static IP with Point-to-Point Protocol over Ethernet (PPPoE). PPPoE is a network protocol for encapsulating Point-to-Point Protocol (PPP) frames inside Ethernet frames. In a particular embodiment, the router 106 of the cabinet level controller 100 can also provide support for a firewall, network address translation (NAT), port forwarding, DMZ, Universal Plug-n-Play (UPnP) & filtering mechanisms.

Referring still to FIGS. 1 and 3, the cabinet level controller 100 of an example embodiment can further include a USB hub 118, which can be integrated into the cabinet level controller 100. As shown in FIG. 1, USB hub 118 of an example embodiment can include a plurality of USB ports for data communications, a power reset button, and a power LED. One of the USB ports can be used to connect the cabinet level controller 100 for downstream data communications. The USB ports of the USB hub 118 can be used to connect the cabinet level controller 100 to various external devices using USB interfaces. These external devices can include sensor devices (e.g., thermometers, pressure sensors, humidity sensors, etc.), recording equipment, test equipment, communication equipment, and the like. The USB ports of the USB hub 118 can also be used to connect the cabinet level controller 100 to network 510.

The cabinet level controller 100 of an example embodiment can further include management interfaces and systems management modules 108/110. The management interfaces and systems management modules 108/110 can be used to configure and monitor various performance metrics and to generate (or respond to) alerts when various performance thresholds are crossed. The management interfaces and systems management modules 108/110 can be used manage these alerts and to log the alerts and system data associated with the alerts or other system conditions. In this manner, the cabinet level controller 100 can maintain real-time operational status information related to each of the devices in an associated rack. This operational status information can be used to detect problems with any of the electric devices in the rack or used to detect problems or failures in network communications. In a particular embodiment, the cabinet level controller 100 of an example embodiment can support a CAN bus interface. A CAN bus (short for controller area network) is a bus standard designed to allow microcontrollers and devices to communicate with each other within a system without a host computer.

The cabinet level controller 100 of an example embodiment can further include environmental sensors 112 for environmental monitoring of temperature, pressure, humidity, and a variety of other environmental conditions. A plurality of sensors can be placed at various locations in and around a rack to monitor the environmental conditions proximate to the rack and the assets therein. The information associated with the environmental conditions measured by the environmental sensors 112 can be processed by the systems management modules 110 to determine if actions need to be taken by the cabinet level controller 100 in view of changing environmental conditions.

The cabinet level controller 100 of an example embodiment can further include access control module 120, which can be integrated into the cabinet level controller 100. In the example embodiment, the access control module 120 is used to monitor and control access to the assets in a rack. The access control module 120 acts as an electronic lock that provides conditional access control to the assets in the rack. In one embodiment, the access control module 120 is configured to communicate with rack locking mechanisms (e.g., in front and back) to control access to the assets in the rack. Access control can be provided via entry of a key code on the touch screen monitor and keypad 104 or via a manual key override. Integrated sensors can be provided for lock and latch status, monitoring, and alai in functions. An optional proximity reader can also be implemented to accept HID 125 kHz proximity cards.

Referring again to FIG. 1, the cabinet level controller 100 of an example embodiment can further include utility outlets/inlets 124. The utility outlets/inlets 124 can provide incoming or outgoing electrical power to or from the cabinet level controller 100.

The cabinet level controller 100 of an example embodiment can further include radio-frequency identification (RFID) receiver 122, which can be integrated into the cabinet level controller 100. RFID is a well-known technology for the wireless non-contact use of radio-frequency electromagnetic fields to transfer data, for the purposes of automatically identifying and tracking tags attached to objects, such as the electric devices in the unit spaces 301 of a rack 300. The tags contain electronically stored information. Some tags are powered and read at short ranges (a few meters) via magnetic fields (electromagnetic induction). Others use a local power source such as a battery, or else have no battery, but collect energy from the interrogating electromagnetic field, and then act as a passive transponder to emit microwaves or UHF radio waves (i.e., electromagnetic radiation at high frequencies). Battery powered tags may operate at hundreds of meters. Unlike a bar code, the tag does not necessarily need to be within line of sight of the reader, and may be embedded in the tracked object. In a particular embodiment, a single medium power near field 13.56 MHz RFID reader can be used. The RFID receiver 122 in the cabinet level controller 100 can receive data signals from the RFID transmitter tags embedded in or attached to each of the electrical assets in rack 300. As described in more detail below, an RFID antenna array can be positioned on or adjacent to the rack 300 to enable the RFID receiver 122 to read the RFID transmitter tags on each asset in each unit space 301 of rack 300. As also described in more detail below, high performance radio-frequency (RF) multiplexer modules allow addressing of 1 of 42 or 1 of 44 RFID antennas to assist in this RFID transmitter tag communication. Thus, the RFID receiver 122 can determine the particular unit space 301 of rack 300 in which a particular electrical asset is positioned. As a result, the cabinet level controller 100 can automatically determine the identity and type of assets that are resident in a particular rack 300. The cabinet level controller 100 can also automatically determine when an electrical asset is added or removed from rack 300. The cabinet level controller 100 can retrieve identifying information from any of the plurality of RFID transmitter tags embedded or attached to each of the electrical assets in rack 300 and store this information in data store 530 (shown in FIG. 9). The cabinet level controller 100 can also use the identifying information from the RFID transmitter tags to retrieve additional information from a network source via network 510 (also shown in FIG. 9). In this manner, the identifying information for a particular electrical asset can be used to retrieve additional information, such as the type of device, the electrical consumption properties of the device, the operational limitations of the device, the configuration of the device, and the like. Again, this additional information for each asset in rack 300 can be stored in data store 530. Thus, the cabinet level controller 100 can provide automatic asset identification and tracking at the rack unit space level. The cabinet level controller 100 can also provide a live inventory of assets and current and precise asset tracking information.

Figure 4:
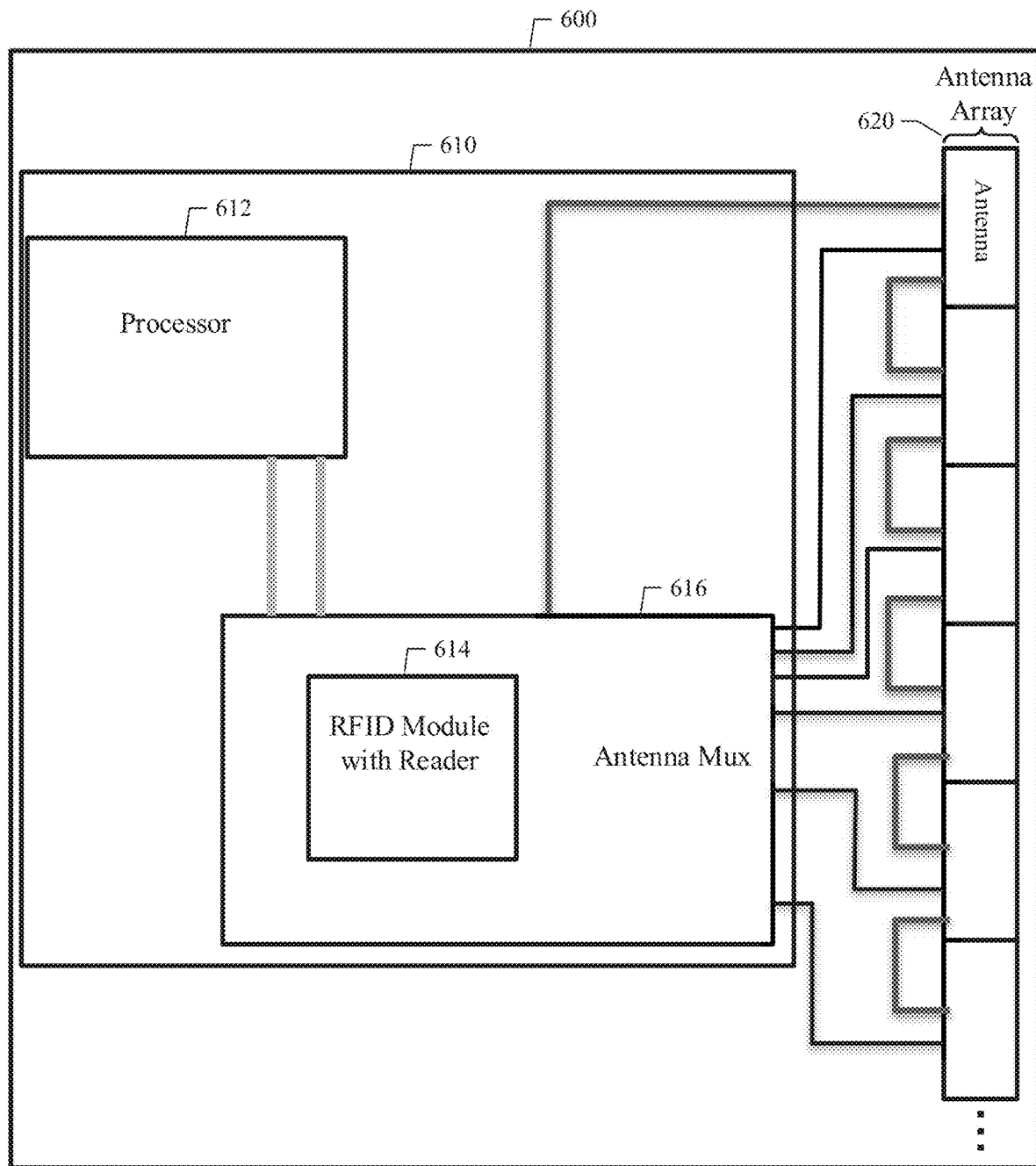
FIG. 4 illustrates an example embodiment of a radio-frequency identification (RFID) asset identification system that may be used with the cabinet level controller in association with a data center equipment rack or cabinet in which electrical assets may physically reside.

FIG. 4 illustrates an example embodiment of an RFID asset identification system 600 that may be used with the cabinet level controller 100 in association with a data center equipment rack or cabinet 300 in which electrical assets may physically reside. In the example embodiment, the RFID asset identification system 600 includes an RFID processing module 610 and an RFID antenna array 620. In a particular embodiment, the RFID processing module 610 may comprise or be incorporated into the RFID receiver 122 described above. In the example embodiment, the RFID processing module 610 can include a processor 612 and an RFID reader module 614. In one embodiment, a conventional RFID reader can be used with the RFID reader module 614 to decode the signals received from the RFID transmitter tags on the assets in rack 300. The processor 612 can be used to configure and control the operation of the RFID reader module 614. The processor 612 can also be used to communicate with other components of the cabinet level controller 100.

The RFID antenna array 620 of RFID asset identification system 600 comprises a plurality of RFID antennas configured to receive signals from the RFID transmitter tags on the assets in rack 300. The general design of standard RFID antennas is well-known in the art. In the example embodiment, each antenna of RFID antenna array 620 can be associated with a corresponding one of the unit spaces 301 of rack 300. As such, each antenna of RFID antenna array 620 can be associated with a corresponding one of the RFID transmitter tags attached to a corresponding asset installed in each unit space 301 of rack 300.

Figure 5:
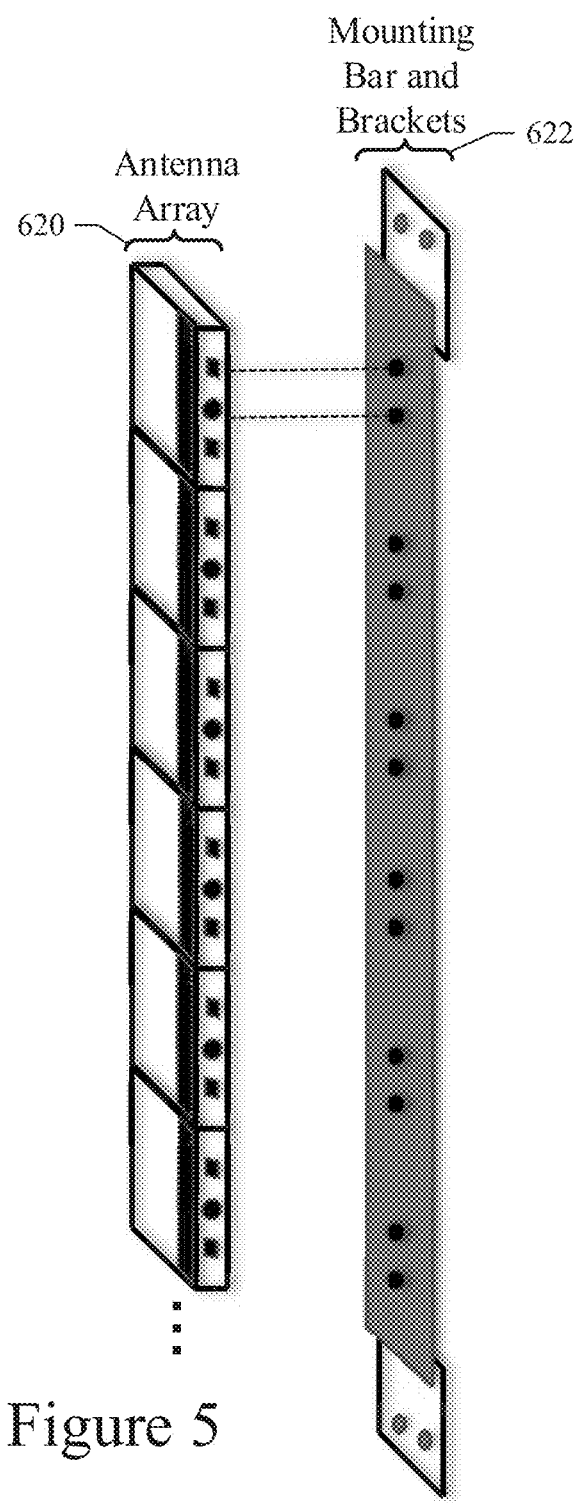
FIG. 5 illustrates an example embodiment of an RFID antenna array of the RFID asset identification system.

As shown in FIGS. 4 and 5, the RFID antenna array 620 of the example embodiment can be configured in a linear strip that can extend vertically from the top of rack 300 to the bottom. As described in more detail below, the RFID antenna array 620 can be mounted to rack 300 or a door of rack 300 with mounting bars and brackets 622 to achieve a close enough proximity between each RFID antenna and a corresponding RFID transmitter tag to enable each RFID antenna to receive the RFID signals emitted from the RFID transmitter tags. The RFID signals can be transferred from the RFID antenna array 620 to the RFID processing module 610 for decoding and processing.

Because the RFID antenna array 620 of an example embodiment provides a plurality of RFID antennas, which can receive RFID signals from a plurality of RFID transmitter tags, the RFID processing module 610 must process RFID signals from a plurality of sources. In the example embodiment shown in FIG. 4, an RFID antenna multiplexer 616 is provided to enable the RFID reader module 614 to communicate with any selected one of the RFID antennas of RFID antenna array 620. Data and control lines shown in FIG. 4 are provided for this purpose. In this manner, the example embodiment does not require the use of multiple RFID readers, which reduces the cost and complexity of the overall system.

Figure 6:
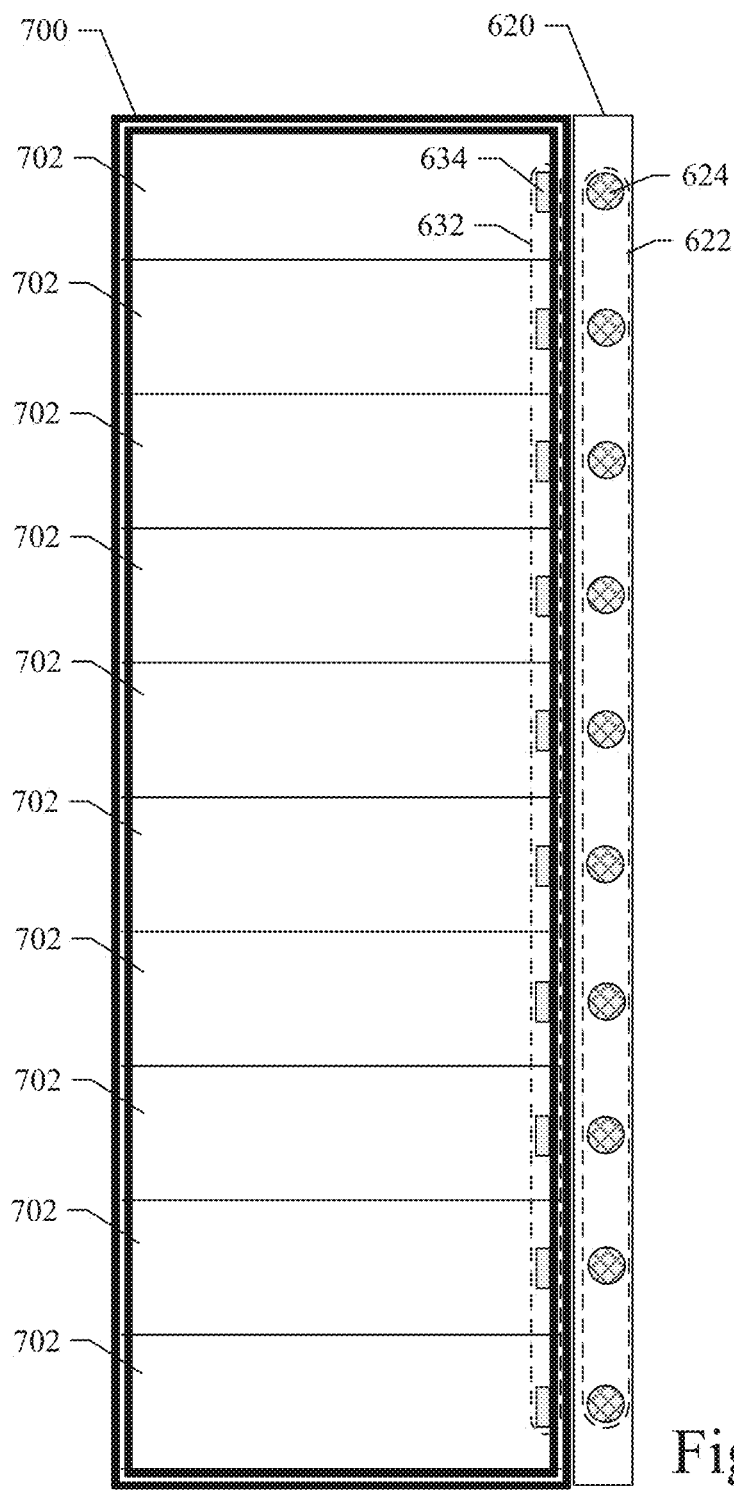
FIGS. 6 and 7 illustrate example embodiments of the RFID antenna array that may be mounted with a data center equipment rack or cabinet in which electrical assets may physically reside.
Figure 7:
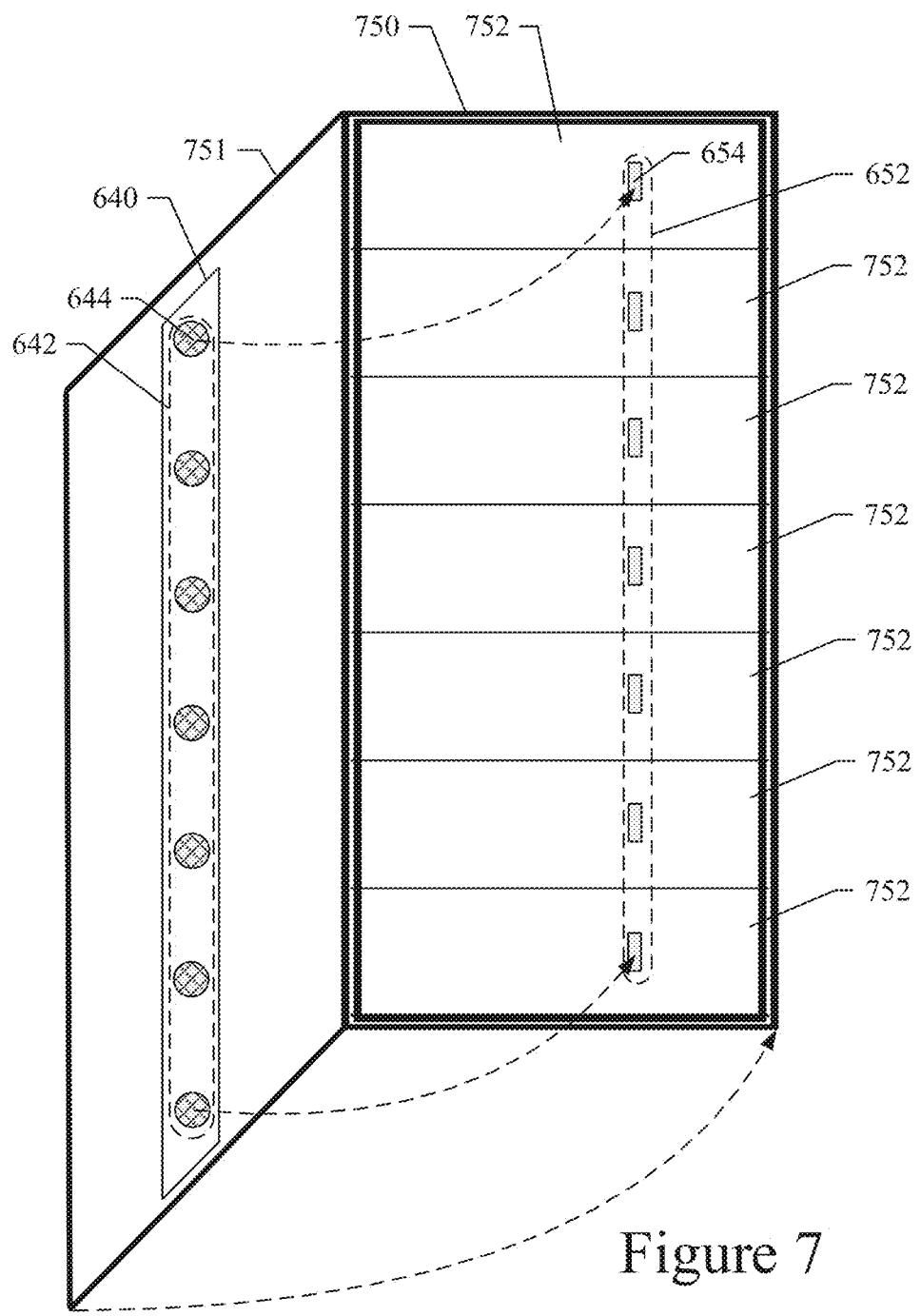

FIGS. 6 and 7 illustrate example embodiments of the RFID antenna array 620 that may be mounted with a data center equipment rack or cabinet 700 in which electrical assets may physically reside. As shown in FIG. 6, RFID antenna array 620 with a plurality of RFID antennas 622 can be mounted on a side of rack 700 and adjacent to the RFID transmitter tags attached to each of the assets in each of the unit spaces 702 of rack 700. The RFID antenna array 620 of the example embodiment can be configured in a linear strip that can extend vertically from the top of rack 700 to the bottom. In this manner, each of the plurality of RFID antennas 622 can be positioned adjacent to a corresponding unit space 702 and an electrical asset resident therein. For example, as shown in FIG. 6, RFID antenna array 620 can be mounted to rack 700 so that RFID antenna 624 is positioned adjacent to a unit space in which an asset carries an RFID transmitter tag 634. By virtue of the close proximity between the RFID transmitter tag 634 and corresponding RFID antenna 624, the RFID antenna 624 can receive the RFID signals emitted by the RFID transmitter tag 634. These RFID signals can be transferred from the RFID antenna 624 to the RFID reader module 614 via the antenna multiplexer 616 of the RFID processing module 610 as described above. In a similar manner, each of the RFID antennas 622 can be positioned adjacent to a corresponding one of the plurality of RFID transmitter tags 632. The antenna multiplexer 616 enables the RFID reader module 614 to select any one of the RFID antennas 622 and receive corresponding RFID signals from one of the RFID transmitter tags 632 proximately located adjacent to the selected RFID antenna 622.

Referring now to FIG. 7, another example embodiment shows an RFID antenna array 640 mounted to a door 751 of a data center equipment rack or cabinet 750 in which electrical assets may physically reside. As shown in FIG. 7, RFID antenna array 640 with a plurality of RFID antennas 642 can be mounted on a door 751 of rack 750 so that when the door 751 is closed (as shown by the dashed arrows in FIG. 7), the plurality of RFID antennas 642 become positioned adjacent to the RFID transmitter tags 652 attached to each of the assets in each of the unit spaces 752 of rack 750. The RFID antenna array 640 of the example embodiment can also be configured in a linear strip that can extend vertically from the top of rack door 751 to the bottom. In this manner, each of the plurality of RFID antennas 642 can be positioned adjacent to a corresponding unit space 752 and an electrical asset resident therein. For example, as shown in FIG. 7, RFID antenna array 640 can be mounted to rack door 751 so that when rack door 751 is closed, RFID antenna 644 is positioned adjacent to a unit space in which an asset carries an RFID transmitter tag 654. By virtue of the close proximity between the RFID transmitter tag 654 and corresponding RFID antenna 644 when rack door 751 is closed, the RFID antenna 644 can receive the RFID signals emitted by the RFID transmitter tag 654. These RFID signals can be transferred from the RFID antenna 644 to the RFID reader module 614 via the antenna multiplexer 616 as described above. In a similar manner, each of the RFID antennas 642 can be positioned adjacent to a corresponding one of the plurality of RFID transmitter tags 652 when rack door 751 is closed. The antenna multiplexer 616 enables the RFID reader module 614 to select any one of the RFID antennas 642 and receive corresponding RFID signals from one of the RFID transmitter tags 652 proximately located adjacent to the selected RFID antenna 642.

FIG. 8 is a flow diagram illustrating the basic processing flow 401 for a particular embodiment. As shown, an example embodiment includes: establishing a data connection between a cabinet level controller and at least one primary power distribution unit (PDU) (processing block 410); using a first electrical outlet on the primary PDU to establish an electrical connection between the primary PDU an electrical asset in a data center equipment rack (processing block 420); using a first asset interface connector on the cabinet level controller to establish a data connection between the cabinet level controller and the electrical asset in the data center equipment rack, the first electrical outlet and the first asset interface connector being in horizontal alignment (processing block 430); using a router integrated into the cabinet level controller to connect the cabinet level controller to a wide area Internet Protocol (IP) network (processing block 440); and using the router to establish a single IP address corresponding to a plurality of electrical assets in the data center equipment rack (processing block 450).

Figure 9:
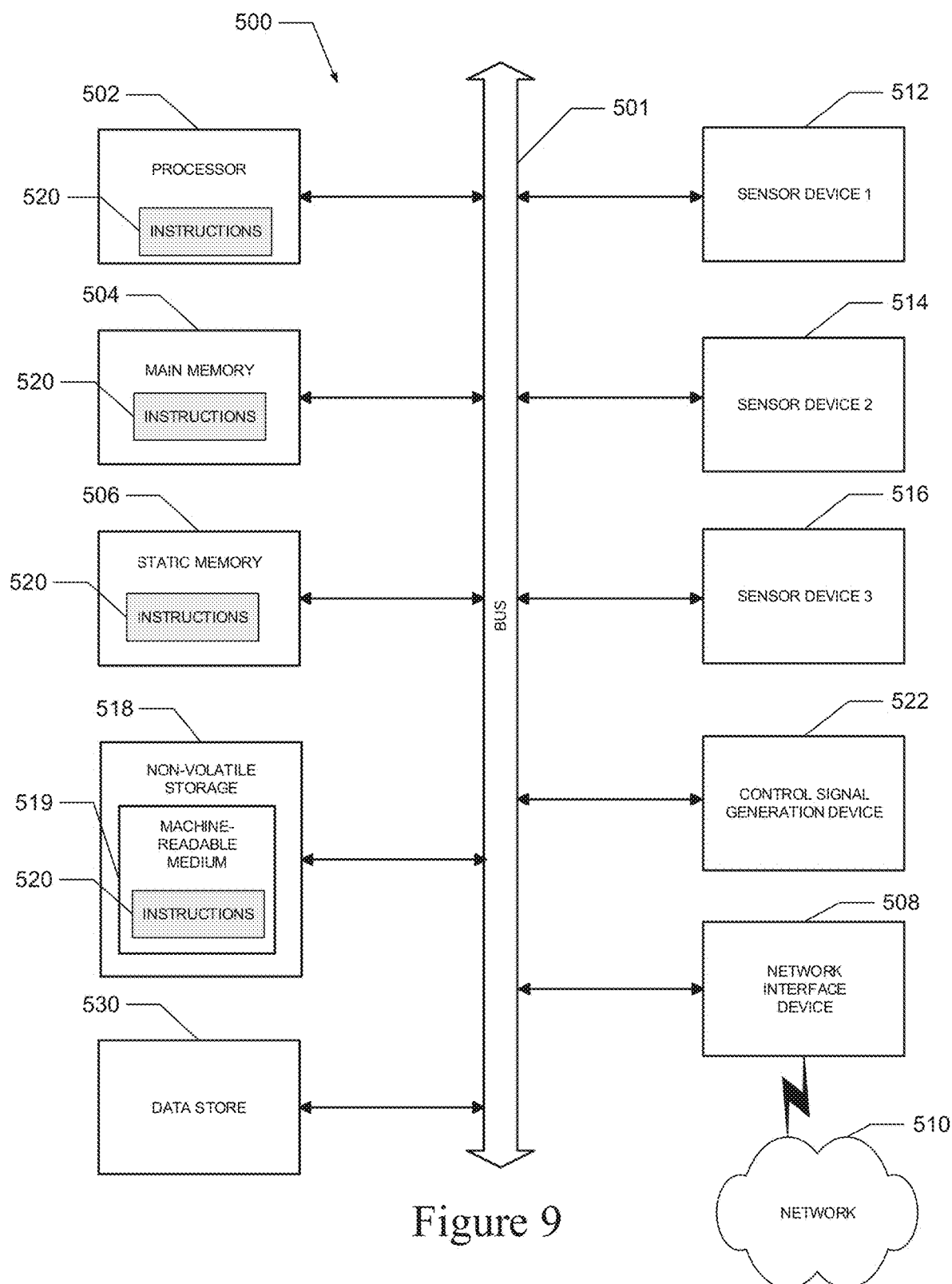
FIG. 9 shows a diagrammatic representation of a machine in the example form of a cabinet level controller within which a set of instructions, for causing the controller to perform any one or more of the methodologies described herein, may be executed.

FIG. 9 shows a diagrammatic representation of a machine in the example form of a cabinet level controller 100 within which a set of instructions, for causing the controller 100 to perform any one or more of the methodologies described herein, may be executed. In alternative embodiments, the controller 100 operates as a standalone device or may be connected (e.g., networked) to other machines. In a networked deployment, the controller 100 may operate in the capacity of a server or a client machine in client-server network environment, or as a peer machine in a peer-to-peer (or distributed) network environment, such as a mesh network. The controller 100 may be a computer, an intelligent controller, a logic device, an application specific integrated circuit (ASIC), a field programmable gate array (FPGA), a hardwired module, an augmented network router, gateway, switch or bridge, or any machine capable of executing a set of instructions (sequential or otherwise) that specify actions to be taken by that machine. Further, while a single machine is illustrated, the term "machine" or "controller" shall also be taken to include any collection of machines that individually or jointly execute a set (or multiple sets) of instructions to perform any one or more of the methodologies described herein.

The example controller 100 can include a processor 502 (e.g., a central processing unit (CPU)), a main memory 504 and optionally a static memory 506, which communicate with each other via a bus 501. The controller 100 may further include one or more sensor devices 512, 514, and 516. These sensor devices can include power consumption or power usage sensors, voltage measurement devices, electrical current measurement devices, wattage measurement devices, inductance measurement devices, electromagnetic field (EMF) measurement devices, temperature sensors, humidity sensors, air pressure sensors, air flow sensors, moisture detectors, and/or other types of sensors for detecting and measuring a desired system or environmental condition.

The controller 100 may further include a non-volatile memory 518, a control signal generation device 522, and a network interface device 508 (e.g., a network interface capable of connection with a network). The non-volatile memory 518 includes a machine-readable medium 519 in which is stored one or more sets of instructions (e.g., software and data 520) embodying any one or more of the methodologies or functions described herein. The instructions 520 may also reside, completely or partially, within the main memory 504, the static memory 506, and/or within the processor 502 during execution thereof by the controller 100. The main memory 504, static memory 506, and the processor 502 also may constitute non-transitory machine-readable media. The software, instructions, and/or related data may further be retained in a data store 530, which may be implemented as an optical or magnetic disk and disk drive, flash memory device, or other well-known data retention device. The software, instructions, and/or related data 520 may further be transmitted or received over a network 510 via the network interface device 508. The network interface device 508, in a wireless node configuration of one embodiment, may include a radio transceiver for sending and receiving data to/from network 510 using a wireless data transfer protocol, such as the family of 802.11 standards from IEEE. In this manner, controller 100 can perform wireless data communications with other devices. The control signal generation device 522 can be used to control the operation of a management system, such as a power management system, electrical control unit, transfer switch, or other device or system that can alter the power consumption or environmental conditions being monitored and controlled by controller 100.

Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In example embodiments, a node configured by an application may constitute a "module" that is configured and operates to perform certain operations as described herein. In other embodiments, the "module" may be implemented mechanically or electronically. For example, a module may comprise dedicated circuitry or logic that is permanently configured (e.g., within a special-purpose processor) to perform certain operations. A module may also comprise programmable logic or circuitry (e.g., as encompassed within a general-purpose processor or other programmable processor) that is temporarily configured by software to perform certain operations. It will be appreciated that the decision to implement a module mechanically, in the dedicated and permanently configured circuitry, or in temporarily configured circuitry (e.g., configured by software) may be driven by cost and time considerations. Accordingly, the term "module" should be understood to encompass a functional entity, be that an entity that is physically constructed, permanently configured (e.g., hardwired) or temporarily configured (e.g., programmed) to operate in a certain manner and/or to perform certain operations described herein.

While the machine-readable medium 519 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any non-transitory medium that is capable of storing, encoding or embodying a set of instructions for execution by the machine and that cause the machine to perform any one or more of the methodologies described herein. The term "machine-readable medium" shall accordingly be taken to include, but not be limited to, solid-state memories, optical media, and magnetic media.

As noted, the software and/or related data may be transmitted over a network using a transmission medium. The term "transmission medium" shall be taken to include any medium that is capable of storing, encoding or carrying instructions for transmission to and execution by the machine, and includes digital or analog communication signals or other intangible media to facilitate transmission and communication of such software and/or data.

The illustrations of embodiments described herein are intended to provide a general understanding of the structure of various embodiments, and they are not intended to serve as a complete description of all the elements and features of components and systems that might make use of the structures described herein. Many other embodiments will be apparent to those of ordinary skill in the art upon reviewing the description provided herein. Other embodiments may be utilized and derived, such that structural and logical substitutions and changes may be made without departing from the scope of this disclosure. The figures herein are merely representational and may not be drawn to scale. Certain proportions thereof may be exaggerated, while others may be minimized. Accordingly, the specification and drawings are to be regarded in an illustrative rather than a restrictive sense.

The description herein may include terms, such as "up", "down", "upper", "lower", "first", "second", etc. that are used for descriptive purposes only and are not to be construed as limiting. The elements, materials, geometries, dimensions, and sequence of operations may all be varied to suit particular applications. Parts of some embodiments may be included in, or substituted for, those of other embodiments. While the foregoing examples of dimensions and ranges are considered typical, the various embodiments are not limited to such dimensions or ranges.

The Abstract is provided to comply with 37 C.F.R. § 1.74(b) to allow the reader to quickly ascertain the nature and gist of the technical disclosure. The Abstract is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments have more features than are expressly recited in each claim. Thus the following claims are hereby incorporated into the Detailed Description, with each claim standing on its own as a separate embodiment.

Thus, as described herein, an apparatus and method for managing assets in a data center device rack are disclosed. Although the disclosed subject matter has been described with reference to several example embodiments, it may be understood that the words that have been used are words of description and illustration, rather than words of limitation. Changes may be made within the purview of the appended claims, as presently stated and as amended, without departing from the scope and spirit of the disclosed subject matter in all its aspects. Although the disclosed subject matter has been described with reference to particular means, materials, and embodiments, the disclosed subject matter is not intended to be limited to the particulars disclosed; rather, the subject matter extends to all functionally equivalent structures, methods, and uses such as are within the scope of the appended claims.

What is claimed is:

1. A method comprising:
   using an electrical outlet on a power distribution unit (PDU) to establish an electrical connection between the PDU and an electrical asset in a data center equipment rack;
   establishing data connections between a cabinet level controller and the PDU;
   coupling a data processor module with the cabinet level controller to control operation of components of the cabinet level controller;
   connecting the data processor module to a network via a network interface;
   coupling a radio-frequency identification (RFID) receiver with the cabinet level controller to automatically identify and track RFID tags attached to each of a plurality of electrical assets in the data center equipment rack, the data processor module using the RFID receiver to determine identity, location, and type of each of the plurality of electrical assets resident in the data center equipment rack; and
   using the data processor module and the identity of each of the plurality of the electrical assets resident in the data center equipment rack to retrieve additional information related to each of the plurality of electrical assets from a network source via the network.

2. The method of claim 1 wherein the electrical outlet and a first asset interface connector are in horizontal alignment.

3. The method of claim 1 including using a second electrical outlet on a secondary PDU to establish a second electrical connection between the secondary PDU and the electrical asset in the data center equipment rack.

4. The method of claim 1 including using a touch screen monitor and keypad, integrated into the cabinet level controller, to directly interact with and configure operation of the cabinet level controller.

5. The method of claim 1 including providing a first asset interface connector of a type from a group: RJ45, Universal Serial Bus (USB), Internet Protocol Keyboard Video Mouse (IP-KVM), and RS-232.

6. The method of claim 1 including integrating a router into the cabinet level controller to connect the cabinet level controller to the network.

7. The method of claim 1 including integrating an Internet Protocol (IP) Keyboard Video Mouse (IP-KVM) module into the cabinet level controller to communicate with the cabinet level controller.

8. The method of claim 1 including integrating a Universal Serial Bus (USB) hub into the cabinet level controller to communicate with the cabinet level controller.

9. The method of claim 1 including using a plurality of environmental sensors to monitor a variety of environmental conditions and to communicate information associated with the variety of environmental conditions to the cabinet level controller.

10. The method of claim 1 including integrating an access controller into the cabinet level controller to monitor and control access to the plurality of electrical assets in the data center equipment rack.

11. A cabinet level controller comprising: an electrical outlet on a power distribution unit (PDU) to establish an electrical connection
   between the PDU and an electrical asset in a data center equipment rack; a data interface for establishing a data connection between the cabinet level controller and the power distribution unit (PDU);
   a data processor module to control operation of components of the cabinet level controller;
   a network interface to connect the data processor module with a network; and
   a radio-frequency identification (RFID) receiver to automatically identify and track RFID tags attached to each of the plurality of electrical assets in the data center equipment rack, the data processor module using the RFID receiver to determine identity, location, and type of each of the plurality of electrical assets resident in the data center equipment rack, the data processor module using the identity of each of the plurality of the electrical assets resident in the data center equipment rack to retrieve additional information related to each of the plurality of electrical assets from a network source via the network.

12. The cabinet level controller of claim 11 wherein the electrical outlet and a first asset interface connector are in horizontal alignment.

13. The cabinet level controller of claim 11 including a second electrical outlet on a secondary PDU to establish a second electrical connection between the secondary PDU and the electrical asset in the data center equipment rack.

14. The cabinet level controller of claim 11 including a touch screen monitor and keypad, integrated into the cabinet level controller, to directly interact with and configure operation of the cabinet level controller.

15. The cabinet level controller of claim 11 including a first asset interface connector of a type from a group: RJ45, Universal Serial Bus (USB), Internet Protocol Keyboard Video Mouse (IP-KVM), and RS-232.

16. The cabinet level controller of claim 11 including a router to connect the cabinet level controller to the network.

17. The cabinet level controller of claim 11 including an Internet Protocol (IP) Keyboard Video Mouse (IP-KVM) module to communicate with the cabinet level controller.

18. The cabinet level controller of claim 11 including a Universal Serial Bus (USB) hub to communicate with the cabinet level controller.

19. The cabinet level controller of claim 11 including a plurality of environmental sensors to monitor a variety of environmental conditions and to process information associated with the variety of environmental conditions.

20. The cabinet level controller of claim 11 including an access controller to monitor and control access to the plurality of electrical assets in the data center equipment rack.

* * * * *